United States Patent
Coquand et al.

(10) Patent No.: US 10,896,956 B2
(45) Date of Patent: Jan. 19, 2021

(54) FIELD EFFECT TRANSISTOR WITH REDUCED CONTACT RESISTANCE

(71) Applicant: COMMISSARIAT A L'ENERGIE ATOMIQUE ET AUX ENERGIES ALTERNATIVES, Paris (FR)

(72) Inventors: Remi Coquand, Les Marches (FR); Shay Reboh, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 15/852,648

(22) Filed: Dec. 22, 2017

(65) Prior Publication Data

US 2019/0198616 A1 Jun. 27, 2019

(51) Int. Cl.
| | |
|---|---|
| H01L 29/08 | (2006.01) |
| H01L 29/06 | (2006.01) |
| H01L 29/66 | (2006.01) |
| H01L 29/423 | (2006.01) |
| H01L 29/78 | (2006.01) |

(Continued)

(52) U.S. Cl.
CPC .......... *H01L 29/0847* (2013.01); *B82Y 10/00* (2013.01); *H01L 21/2255* (2013.01); *H01L 29/0653* (2013.01); *H01L 29/0673* (2013.01); *H01L 29/401* (2013.01); *H01L 29/41725* (2013.01); *H01L 29/42392* (2013.01); *H01L 29/66439* (2013.01); *H01L 29/66553* (2013.01); *H01L 29/66795* (2013.01);

(Continued)

(58) Field of Classification Search
CPC .......... H01L 29/42392; H01L 29/0673; H01L 29/78696; H01L 29/66439; H01L 29/775; H01L 29/66553; H01L 29/0847; H01L 29/0653; H01L 29/7853; H01L 2029/7858
USPC .......... 257/8, 347, 27, 384, 368, 9; 438/151
See application file for complete search history.

(56) References Cited

U.S. PATENT DOCUMENTS

| | | | | |
|---|---|---|---|---|
| 10,008,583 | B1* | 6/2018 | Rodder | ............... H01L 29/0653 |
| 2014/0001441 | A1* | 1/2014 | Kim | ................... H01L 21/30604 |
| | | | | 257/29 |

(Continued)

OTHER PUBLICATIONS

Y. Sasaki, et al., "Novel Junction Design for NMOS Si Bulk-FinFETs with Extension Doping by PEALD Phosphorous Doped Silicate Glass", IEEE, 2015, Coquand IEDM15, pp. 15-596-15-599.

(Continued)

*Primary Examiner* — Mohammed Shamsuzzaman
*Assistant Examiner* — Aaron J Gray
(74) *Attorney, Agent, or Firm* — Oblon, McClelland, Maier & Neustadt, L.L.P.

(57) ABSTRACT

FET transistor (100) comprising:
- a semiconductor portion (104) of which a first part (106) forms a channel;
- a gate (108) at least partly surrounding the first part;
- internal dielectric spacers (112) arranged around doped second parts (114) of the semiconductor portion between which the first part is arranged and which form extension regions;
- electrically conductive portions (120) in contact with doped surfaces of extremities (118) of the semiconductor portion and with doped surfaces of third parts (116) of the semiconductor portion, forming part of the source and drain regions, at least partly surrounding the third parts, with each of the second parts being arranged between the first part and one of the third parts.

13 Claims, 5 Drawing Sheets

(51) Int. Cl.
*H01L 29/775* (2006.01)
*H01L 29/40* (2006.01)
*H01L 29/417* (2006.01)
*H01L 21/225* (2006.01)
*B82Y 10/00* (2011.01)

(52) U.S. Cl.
CPC ........ H01L 29/775 (2013.01); H01L 29/7853 (2013.01); *H01L 2029/7858* (2013.01)

(56) References Cited

U.S. PATENT DOCUMENTS

| | | | |
|---|---|---|---|
| 2015/0090958 A1* | 4/2015 | Yang | H01L 29/0676 257/27 |
| 2015/0270340 A1* | 9/2015 | Frank | H01L 29/775 257/347 |
| 2016/0027870 A1* | 1/2016 | Cheng | H01L 29/42392 257/347 |
| 2017/0162651 A1* | 6/2017 | Suk | H01L 29/66439 |
| 2018/0047832 A1* | 2/2018 | Tapily | H01L 29/7833 |
| 2018/0090582 A1* | 3/2018 | Adusumilli | H01L 21/82382 |

OTHER PUBLICATIONS

U.S. Appl. No. 15/490,212, filed Apr. 18, 2017, US 2017-0309483 A1, Shay Reboh, et al.
U.S. Appl. No. 15/452,049, filed Mar. 7, 2017, US 2017-0263607 A1, Sylvain Maitrejean, et al.
U.S. Appl. No. 15/523,742, filed May 2, 2017, US 2017-0358459 A1, Shay Reboh, et al.
U.S. Appl. No. 15/602,829, filed May 23, 2017, US 2017-0345931 A1, Shay Reboh, et al.
U.S. Appl. No. 15/603,738, filed May 24, 2017, US 2017-0345915 A1, Remi Coquand, et al.
U.S. Appl. No. 15/852,050, filed Dec. 22, 2017, Shay Reboh, et al.
U.S. Appl. No. 15/711,549, filed Sep. 21, 2017, Shay Reboh, et al.
U.S. Appl. No. 14/555,897, filed Dec. 18, 2014, US 2015-0179474 A1, Sylvain Maitrejean, et al.
U.S. Appl. No. 14/575,329, filed Dec. 18, 2014, US 2015-0179474 A1, Sylvain Maitrejean, et al.
U.S. Appl. No. 14/950,416, filed Nov. 24, 2015, US 2016-0149039 A1, Shay Reboh, et al.
U.S. Appl. No. 15/092,002, filed Apr. 6, 2016, US 2016-0300927 A1, Shay Reboh, et al.
U.S. Appl. No. 15/261,226, filed Sep. 9, 2016, US 2017-0076997 A1, Shay Reboh, et al.
U.S. Appl. No. 15/837,298, filed Dec. 11, 2017, Sylvain Barraud, et al.
U.S. Appl. No. 15/837,405, filed Dec. 11, 2017, Shay Reboh, et al.
U.S. Appl. No. 15/837,217, filed Dec. 11, 2017, Shay Reboh, et al.
U.S. Appl. No. 15/837,281, filed Dec. 11, 2017, Shay Reboh, et al.
U.S. Appl. No. 15/852,648, filed Dec. 22, 2017, Remi Coquand, et al.
U.S. Appl. No. 15/852,681, filed Dec. 22, 2017, Shay Reboh, et al.
U.S. Appl. No. 15/852,671, filed Dec. 22, 2017, Shay Reboh, et al.

* cited by examiner

FIELD EFFECT TRANSISTOR WITH REDUCED CONTACT RESISTANCE

TECHNICAL FIELD AND PRIOR ART

The invention relates to the field of FET (Field Effect Transistors) transistors comprising a channel formed from one or more portions of semiconductor arranged above a substrate. The invention advantageously applies to GAAFET (Gate All Around Field Effect Transistors) transistors, wherein the channel is formed of one or more nanowires or nanosheets. The invention applies in particular to the manufacture of FET transistors intended for high-performance low power consumption logic applications in microelectronics.

A GAAFET transistor 10 is shown in FIG. 1A. This transistor 10 is made on a silicon substrate 12. The channel of the transistor 10 is formed by three silicon nanowires 14 superimposed above each other and suspended above the substrate 12. A first part 16 of each nanowire 14 is covered by a gate 18 arranged between external spacers 20. These first parts 16 of the nanowires 14 form the transistor channel 10. The transistor 10 also comprises internal spacers 22 arranged around the second parts 24 of each nanowire 14. In FIG. 1A the second parts 24 are symbolically demarcated from the first parts 16 by broken lines. These second parts 24 of the nanowires 14 form extension regions interposed between the channel, that is the first parts 16 of the nanowires 14, and the source and drain regions 26, 28 in contact with the extremities 30 of the nanowires 14, and formed in particular by epitaxy of semiconductor upon which electrical contacts (not visible in FIG. 1A) are made. A detailed view of a part of the transistor 10 where one of the extension regions of the transistor 10 is located is shown in FIG. 1B.

In the transistor 10 which can be seen in FIGS. 1A and 1B, the contact surface between the extension regions, formed by the second parts 24 of the nanowires 14, and the source and drain regions 26, 28 corresponds only to the surface of the extremities 30 of the nanowires 14 (surface perpendicular to the direction of current flow in the nanowires 14, that is perpendicular to the X axis shown in FIGS. 1A and 1B). This contact surface is limited, given the small dimensions of the nanowires 14. The contact electrical resistance value, which ideally should be as small as possible, between the source and drain region and the channel at this contact surface is inversely proportional to the value of this contact surface area. With the architecture of the transistor 10 described above wherein the dimensions of the nanowires 14 are generally as small as possible to ensure small overall dimensions, it is therefore difficult to reduce the value of this contact electrical resistance of the transistor 10.

DESCRIPTION OF THE INVENTION

One aim of the present invention is to propose a FET transistor whose architecture is such that for a channel region of given dimensions, the contact electrical resistance value between the extension regions and the source and drain regions of the FET transistor is reduced.

To do this the present invention proposes an FET transistor which comprises at least:
- a semiconductor portion of which a first part forms a channel of the FET transistor;
- a gate which at least partly surrounds the first part of the semiconductor portion;
- internal dielectric spacers arranged around second parts of the semiconductor portion between which the first part of the semiconductor portion is arranged and which form extension regions of the FET transistor;
- electrically conductive portions in contact with doped surfaces of extremities of the semiconductor portion and with doped surfaces of third parts of the semiconductor portion forming part of the source and drain regions of the FET transistor, at least partly surrounding the third parts of the semiconductor portion, with each of the second parts of the semiconductor portion being arranged between the first part of the semiconductor portion and one of the third parts of the semiconductor portion.

Thus in this transistor it is proposed that the dimensions of the internal spacers be reduced so that they do not cover the third parts of the semiconductor portion which extend from the extremities of the semiconductor portion up to the second parts of the semiconductor portion forming the extension regions of the transistor. These third parts and the extremities are each doped so as to form, with the electrically conductive portions, the source and drain regions of the transistor. The contact surface between the semiconductor portion (or semiconductor portions when the transistor channel is formed of several distinct semiconductor portions), at the third parts and extremities of the semiconductor portion, and electrically conductive portions of the source and drain regions obtained with such an architecture is therefore greater than that obtained in the structure of the FET transistor of the prior art described above since this contact surface area here corresponds to the sum of the doped surfaces of the extremities and of the third parts of the semiconductor portion or portions. Thus the contact surface area between the source and drain regions and the semiconductor portion or portions forming the transistor channel is greater, which is expressed as a reduction in the contact electrical resistance between the source and drain regions and the transistor channel.

Given the doping carried out at the surface of the third parts of the semiconductor portion, it is not necessary to undertake epitaxy of semiconductor portions in order to obtain the source and drain regions of the transistor. The electrically conductive portions that are directly in contact with the doped surfaces of the extremities and of the third parts of the semiconductor portion or portions therefore enable the total overall dimensions of the FET transistor to be greatly reduced. This transistor is therefore compatible with integration of several FET transistors carried out on the same substrate at a high density.

The surfaces of the extremities of the semiconductor portion correspond to the surfaces of this semiconductor portion which are substantially perpendicular to the direction of the current passing in this semiconductor portion during transistor operation.

The transistor may be such that:
- the semiconductor portion is suspended above a substrate;
- a part of the gate is arranged between the first part of the semiconductor portion and the substrate;
- a part of each of the internal dielectric spacers is arranged between one of the second parts of the semiconductor portion and the substrate;
- a part of each of the electrically conductive portions is arranged between one of the third parts of the semiconductor portion and the substrate.

Such a configuration corresponds, for example, to that of a GAAFET transistor. The semiconductor portion may correspond to a semiconductor nanowire or nanosheet, or more generally a semiconductor nanostructure whose first part forming the channel is surrounded by the transistor gate, passing in particular between the substrate and the channel.

Alternatively, the semiconductor portion may be arranged on the substrate. This configuration corresponds, for example, to that of a FinFET transistor, wherein a part of the gate is not arranged between the substrate and the channel.

The transistor may comprise several semiconductor portions suspended above the substrate and such that first parts of the semiconductor portions together form the transistor channel, and:
- the gate may surround each of the first parts of the semiconductor portions;
- the internal dielectric spacers may be arranged around second parts of each of the semiconductor portions;
- the electrically conductive portions may be in contact with the doped surfaces of the extremities of each of the semiconductor portions and with the doped surfaces of the third parts of each of the semiconductor portions.

The second parts of the semiconductor portion may comprise doped surfaces.

In general, the expression "doped surface" may designate doping performed from an exterior surface of a portion of material and to a depth in this portion of material which is less than the total thickness of the portion of material. In the case of the transistor described in this document, the doping carried out at the doped surfaces of the extremities, at the third parts and possibly the second parts of the semiconductor portion may extend from the external surfaces to a depth, for example, of between 1 nm and 5 nm. This doping is performed such that the dopants are not found in the channel.

The internal dielectric spacers may comprise a material with a dielectric permittivity which is less than or equal to about 3.9. Such a so-called "Low-k" material is advantageous since it allows very thin internal dielectric spacers to be made, that is, which have a thickness (the dimension of the internal dielectric spacers which is substantially parallel to the direction in which current passes in the transistor channel) for example between 2 nm and 8 nm and for example equal to about 6 nm. Such thin dielectric spacers contribute to the possibility of making the transistor with small dimensions.

The FET transistor may moreover comprise external dielectric spacers between which the gate is arranged and partially surrounding an assembly formed at least by the second and third parts of the semiconductor portion, the internal dielectric spacers and the parts of the electrically conductive portions in contact with the doped surfaces of the third parts of the semiconductor portion.

The electrically conductive portions may comprise at least one metal, and may be formed, for example, of stacks of several electrically conductive materials.

A layer of silicide may be interposed between the doped surfaces of the extremities and third parts of the semiconductor portion and the electrically conductive portions.

The invention also relates to a method for making at least one FET transistor, comprising at least the implementation of the following steps:
- making of at least one semiconductor portion, a first part of which is intended to form a FET transistor channel and which moreover comprises second parts between which is arranged the first part of the semiconductor portion and intended to form extension regions of the FET transistor, as well as third parts intended to form part of the source and drain regions of the FET transistor and such that each of the second parts of the semiconductor portion is arranged between the first part of the semiconductor portion and one of the third parts of the semiconductor portion;
- making of a dummy gate which at least partly surrounds the first part of the semiconductor portion;
- doping of at least the third parts of the semiconductor portion and of extremities of the semiconductor portion;
- deposition of at least one dielectric material around the second and third parts of the semiconductor portion;
- removal of portions of the dielectric material arranged around the third parts of the semiconductor portion, with remaining portions of the dielectric material arranged around the second parts of the semiconductor portion forming internal dielectric spacers;
- removal of the dummy gate and making, in a location formed by the removal of the dummy gate, of a gate at least partly surrounding the first part of the semiconductor portion;
- making electrically conductive portions in contact with doped surfaces of extremities of the semiconductor portion and with doped surfaces of the third parts of the semiconductor portion and at least partly surrounding the third parts of the semiconductor portion.

The doping of the extremities and of the third parts of the semiconductor portion can be performed by implementing the following steps:
- deposition, at least against the surface formed by the extremities and the third parts of the semiconductor portion, of a dielectric material comprising dopants;
- thermal annealing which diffuses the dopants from the dielectric material comprising the dopants to within the semiconductor of the extremities and of the third parts of the semiconductor portion;
- removal of the dielectric material comprising the dopants.

The doping step may be implemented such that the second parts of the semiconductor portion are also doped.

The method may moreover comprise:
- between the steps for removal of the portions of the dielectric material and removal of the dummy gate, deposition of a dielectric encapsulation material arranged against the extremities of the semiconductor portion, the third parts of the semiconductor portion and the internal dielectric spacers;
- between the steps for removal of the dummy gate and of making of electrically conductive portions, a step for etching of locations of electrically conductive portions in the dielectric encapsulation material, with the electrically conductive portions subsequently being made in the etched locations.

The method may moreover comprise, between the steps for removal of the portions of dielectric material and for deposition of the dielectric encapsulation material and/or between the steps for etching the locations of the electrically conductive portions in the dielectric encapsulation material and for creating electrically conductive portions, the implementation of a step for silicidation of the doped surfaces of the extremities and of the third parts of the semiconductor portion.

The method may moreover comprise, before the implementation of the doping of the third parts and of the extremities of the semiconductor portion, the making of external dielectric spacers between which the dummy gate is arranged, with the external dielectric spacers being made such that they subsequently partly cover an assembly formed by at least the second and third parts of the semiconductor portion, the internal dielectric spacers and the parts of the electrically conductive portions in contact with the doped surfaces of the third parts of the semiconductor portion.

BRIEF DESCRIPTION OF THE DRAWINGS

The present invention will be better understood on reading the description of example embodiments given, purely as an indication and in no sense restrictively, whilst making reference to the appended illustrations in which.

Figure 1A:
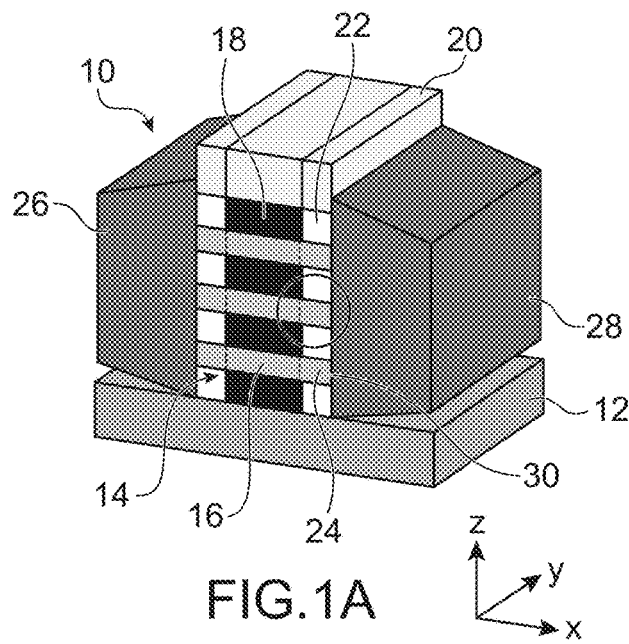
FIGS. 1A and 1B show a GAAFET transistor according to the prior art.
Figure 1B:
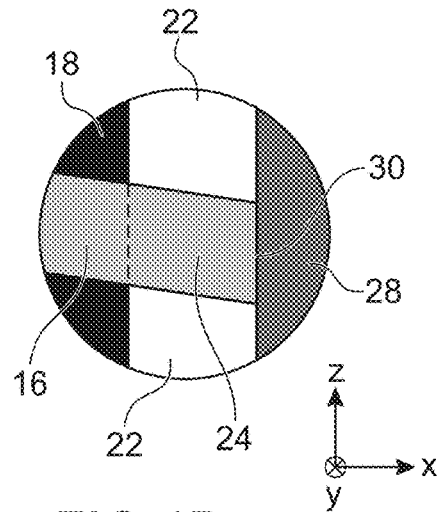

Identical, similar or equivalent parts of the various figures described hereafter bear the same numeric references so as to facilitate passing from one figure to another.

In order to make the figures more readable, the various parts shown in the figures are not necessarily shown at a uniform scale.

The various possibilities (variants and embodiments) must be understood as not being mutually exclusive, and being capable of being combined with one another.

DETAILED DESCRIPTION OF SPECIFIC EMBODIMENTS

A FET transistor 100 according to one specific embodiment is described below in association with FIGS. 2A and 2B. In this specific embodiment, the transistor 100 corresponds to a GAAFET transistor.

The transistor 100 is made on a substrate 102. In this specific embodiment the substrate 102 corresponds to a so-called "bulk" substrate comprising a semiconductor, silicon.

Alternatively, the substrate upon which the transistor 100 is made may correspond to a semiconductor-on-insulator, for example 501 (Silicon On Insulator) or SiGeOI (SiGE On Insulator) type substrate. In this case the reference 102 seen in FIGS. 2A and 2B designates the buried dielectric layer, or BOX (Buried Oxide) layer, of this substrate.

The transistor 100 comprises one or more portions of semiconductor 104, for example made of silicon. In the specific embodiment described here, these portions 104 correspond to semiconductor nanowires suspended above the substrate 102 and arranged one above the other. In the example shown in FIG. 2A the transistor 100 comprises three portions 104. More generally, the number of portions 104 of the transistor 100 may be between 1 and 10.

Figure 2A:
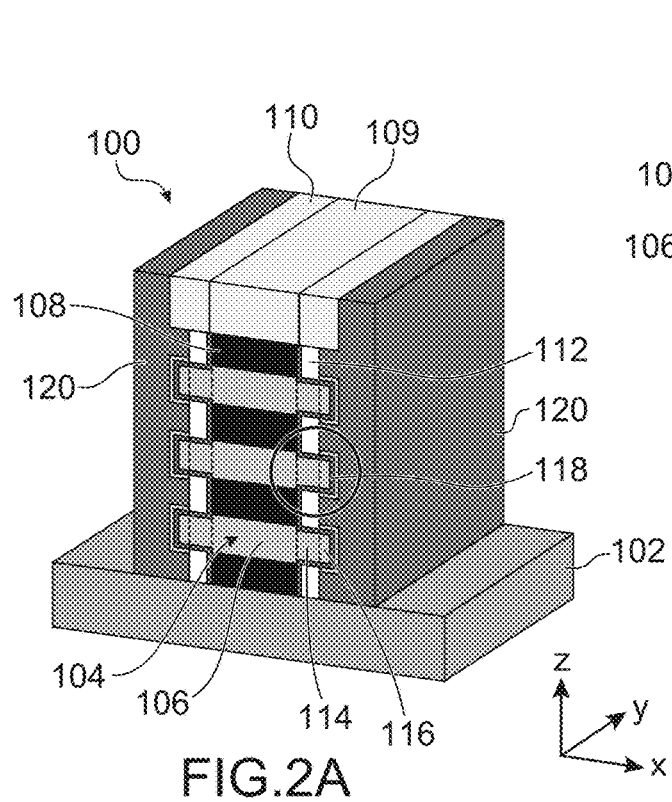
FIGS. 2A and 2B show a FET transistor that is the subject of the present invention, according to one specific embodiment.
Figure 2B:
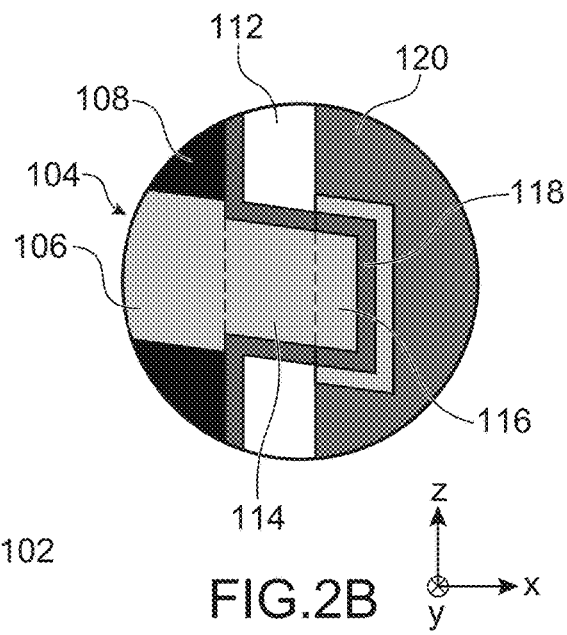

Alternatively the portion or portions 104 may correspond to nanostructures whose form differs from that of nanowires, for example nanosheets (whose width, which corresponds to the dimension along the Y axis shown in FIGS. 2A and 2B, is greater than the height, which corresponds to the dimension along the Z axis shown in FIGS. 2A and 2B).

The length of each of the portions 104 (dimension substantially parallel to the direction of the current flow in these portions 104, and here parallel to the X axis shown in FIGS. 2A and 2B) is, for example, between about 10 nm and 150 nm. Moreover, the height of each of the portions 104 (dimension substantially parallel to the Z axis shown in FIGS. 2A and 2B) is, for example, between about 3 nm and 12 nm.

The channel of the transistor 100 is formed by first parts 106 of the portions 104. These first parts 106 of the portions 104 are covered and surrounded by a gate 108 formed of at least one gate dielectric covered with at least one electrically conductive material which forms the gate conductive material.

The transistor 100 also comprises external dielectric spacers 110 between which the gate 108 and a gate electrical contact 109, which electrically contact the gate conductive material, are arranged.

The transistor 100 also comprises internal dielectric spacers 112 arranged around second parts 114 of the portions 104. In each of the portions 104, the first part 106 is arranged between two second parts 114 of the portion 104. The second parts 114 of the portions 104 form extension regions of the transistor 100, that is, interface regions between the channel and the source and drain regions of the transistor 100. In FIGS. 2A and 2B the second parts 114 of the portions 104 are symbolically separated from the first parts 106 of the portions 104 by broken lines.

Unlike the transistor 10 of the prior art wherein the internal spacers 22 extend up to the extremities 30 of the nanowires 14, the internal dielectric spacers 112 do not cover third parts 116 of the portions 104 which are such that each of the second parts 114 of each of the portions 104 is arranged between the first part 106 of this portion 104 and one of the third parts 116 of each portion 104. In FIGS. 2A and 2B the second parts 114 of the portions 104 are symbolically separated from the third parts 116 of the portions 104 by broken lines.

In the specific embodiment described here, the internal dielectric spacers 112 comprise a dielectric material of dielectric permittivity less than or equal to about 3.9 and correspond, for example, to SiN (dielectric permittivity equal to about 7). Such a dielectric material corresponds to a so-called "Low-k" dielectric material.

In the specific embodiment described here, the internal dielectric spacers 112 moreover have a thickness (dimension substantially parallel to the direction of the current flow in the transistor channel, that is, here substantially parallel to the X axis shown on FIGS. 2A and 2B) of for example between about 2 nm and 10 nm, and for example equal to about 6 nm.

The surfaces of the portions 104 which are perpendicular to the direction along which the portions 104 extend, and perpendicular to the X axis shown in FIGS. 2A and 2B, and which is found at the end of the third parts 116 of the portions 104, form extremities 118 of the portions 104.

The extremities 118, the third parts 116 and the second parts 114 of the portions 104 are doped at least at the surface in a conforming manner. In other words, the doped semiconductor of the extremities 118, of the third parts 116 and of the second parts 114 of the portions 104 is located in a part of the thickness of the portions 104 which extends from the external surface of the portions 104 and only to a depth which is part of the total thickness of the portions 104. This depth is for example between 1 nm and 5 nm.

The doping of the semiconductor of the extremities 118, of the third parts 116 and of the second parts 114 of the portions 104 may be of the n or p type, depending on the type of transistor 100.

The transistor 100 also comprises electrically conductive portions 120 in electrical contact with the doped surfaces of the extremities 118 and of the third parts 116 of the portions 104. These electrically conductive portions 120 form part of the source and drain regions of the transistor 100. The electrically conductive portions 120 are for example each formed from one or more electrically conductive materials. By way of an example, each of the electrically conductive portions 120 may be formed, for example, of a stack of Ti, of TiN and of W.

Because of the large contact surface area between the electrically conductive portions 120 and the doped semiconductor surfaces of the extremities 118 and of the third parts 116 of the portions 104, the contact resistance between these elements of the transistor 100 is greatly reduced.

An example of a method for making the transistor 100 is described below in association with FIGS. 3 to 12.

A stack of first and second layers, arranged alternately one on top of the other is formed on the substrate 102. The second layers are intended to form the portions 104 and here comprise silicon. The first layers comprise a material capable of being selectively etched relative to that of the second layers. In the method example described here, the first layers comprise SiGe.

When the substrate 102 corresponds to a semiconductor-on-insulator type substrate, the reference 102 may designate the buried dielectric layer and the first layer arranged against this buried dielectric layer may correspond to the surface layer of the substrate.

A dummy gate 122, or temporary gate, and external dielectric spacers 110 are made on this stack of first and second layers. This stack is then etched in order to retain only the parts of these layers which are covered by the dummy gate 122 and by the external dielectric layers 110. The remaining parts of the second layers correspond to the portions 104. Parts of the first layers, with similar dimensions to those of the portions 104, are arranged between the portions 104 and between the first portion 104 (that nearest to the substrate 102) and the substrate 102. The parts of the portions 104 covered by the dummy gate 122 correspond to the first parts 106 intended to form the channel of the transistor 100.

Figure 3:
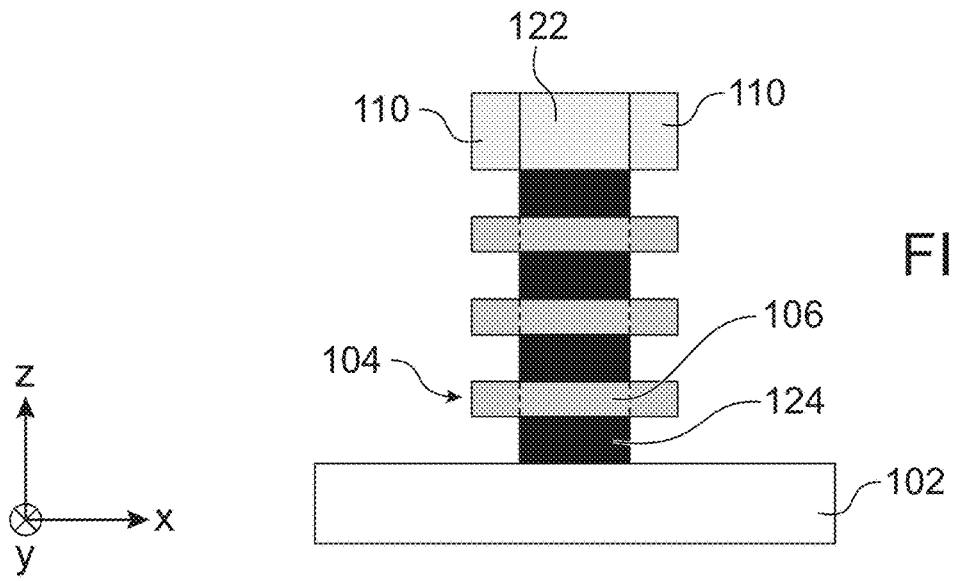
FIGS. 3 to 12 show the steps in a method for making a FET transistor which is the subject of the present invention according to a specific embodiment.
Figure 4:
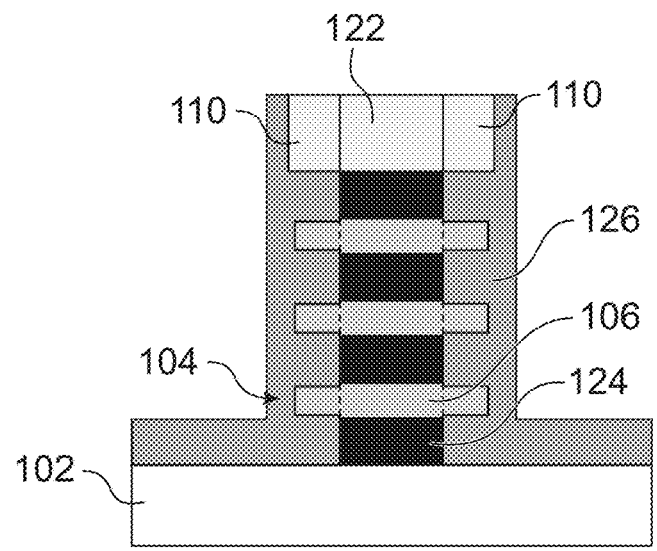

As shown in FIG. 3, the remaining parts of the first layers are then partly etched from their lateral faces (faces parallel to the (Z, Y) plane shown in FIG. 3). This etching is implemented such that the portions of the first layers located beneath the external dielectric spacers 110, or at the base of the external dielectric layers 110, are removed. At the end of this etching only the parts 124 of the first layers surrounding the first parts 106 of the portions 104 are retained. Thus the semiconductor of the portions 104 intended to form the second parts 114 and the third parts 116 as well as the extremities 118 of the portions 104, is not covered by the material of the first layers, here SiGe.

Doping of the semiconductor of the portions 104 not covered by the parts 124 is then carried out. To do this a dielectric material 126 comprising dopants is deposited in a conforming manner onto the previously made structure (FIG. 4), and in particular against the extremities 118 of the portions 104 as well as in the empty spaces left by the previous partial etching of the remaining parts of the first layers. This dielectric material 126 is for example an oxide such as PSG (Phosphosilicate Glass). The nature of the dopants present in this dielectric material depends on the type (n or p) of doping intended to be carried out to form the source and drain regions of the transistor 100. The dopant concentration in the dielectric material 126 may be between about $10^{19}$ at/cm$^3$ and $10^{22}$ at cm$^3$.

At the end of this deposition, the dielectric material 126 in particular covers the extremities 118 as well as the surfaces of the second parts 114 and of the third parts 116 of the portions 104.

Annealing is then carried out to cause thermal diffusion of the dopants from the dielectric material 126 across the surfaces of the semiconductor of portions 104 which are covered by the dielectric material 126. The temperature at which this annealing is performed is for example between about 800° C. and 1100° C., for a duration for example of less than about 10 seconds (and for example equal to about 1 second), and is adjusted so as to prevent atoms of semiconductor diffusing from the parts 124 into the semiconductor of the portions 104, that is, here, to prevent diffusion of germanium atoms from parts 124 into the silicon of portions 104.

The doping thus carried out is uniform over the entire surface of the semi-conductor which is covered by the dielectric material 126. This doping by thermal diffusion moreover avoids doping of the semiconductor of the first parts 106 of the portions 104 intended to form the channel of the transistor 100. This doping technique also has the advantage of not damaging the doped surfaces. The parts of the portions 104 wherein doping is performed in particular correspond to all the parts other than the first parts 106, and which are intended to form part of the extension regions of the transistor 100 as well as the source and drain regions of the transistor 100.

A detailed example of the implementation of such doping is described in the document "Novel Junction Design for NMOS Si Bulk-FinFETs with Extension Doping by PEALD Phosphorus Doped Silicate Glass" by Y. Sasaki et al., IEDM15 596-599.

Figure 5:
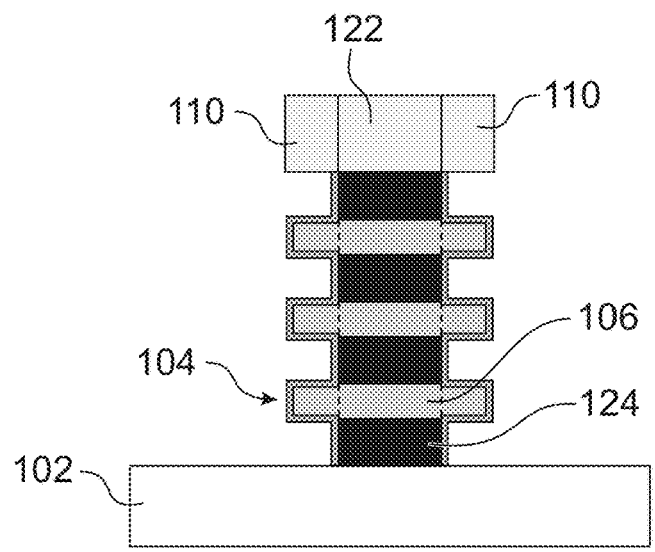

At the end of this annealing, the dielectric material 126 is removed (FIG. 5). This removal is achieved, for example, using a HF solution.

Figure 6:
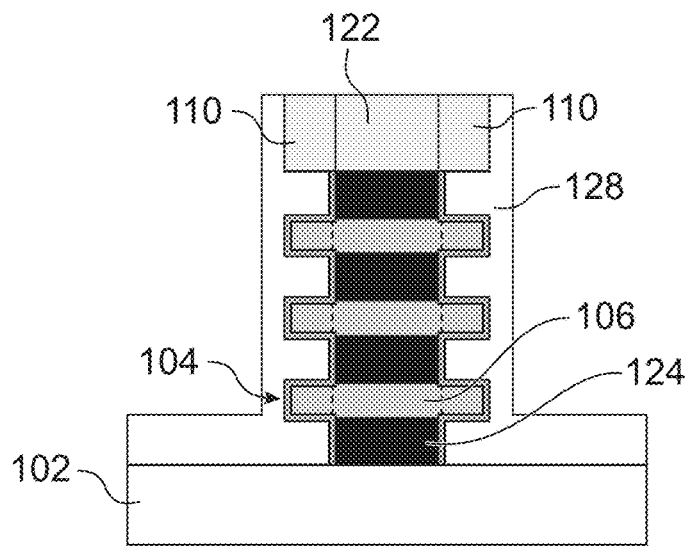

A dielectric material 128, for example SiN, is then deposited in a substantially conforming manner around the previously formed structure (FIG. 6). This dielectric material 128 is in particular deposited between the portions 104, against the lateral faces of the portions 124 of SiGe, that is, in the empty spaces left by the previous partial etching of the remaining parts of the first layers.

Figure 7:
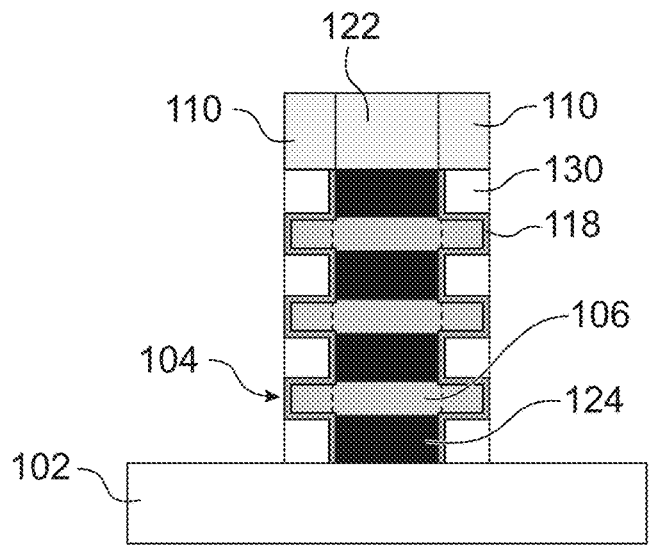

Isotropic etching is then carried out in order to remove the portions of the dielectric material 128 which are not arranged in the empty spaces left by the previous partial etching of the remaining parts of the first layers. Only the remaining portions 130 of the dielectric material are retained (FIG. 7). This isotropic etching is, for example, wet etching implemented using phosphoric acid. At the end of this etching the extremities 118 of the portions 104 are no longer covered by the dielectric material 128.

Figure 8:
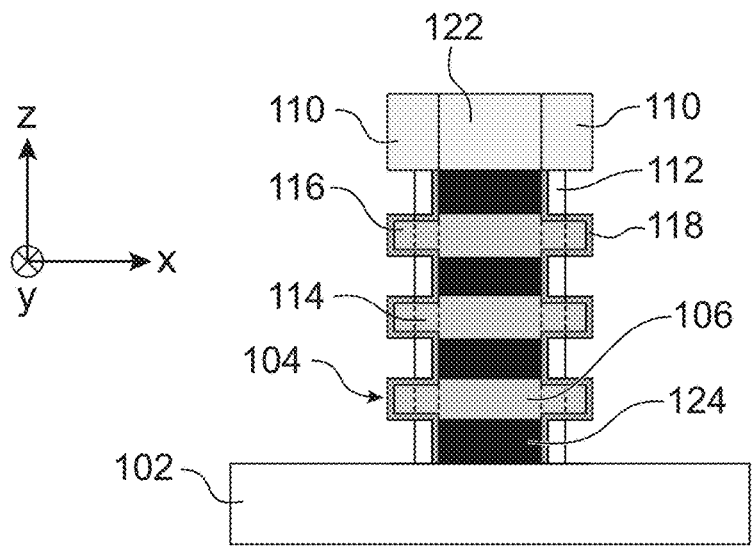

As shown in FIG. 8, partial etching of the remaining portions 130 is carried out, so that the third parts 116 of the portions 104 are no longer covered by the dielectric material of the remaining portions 130. This partial etching corresponds, for example, to isotropic etching, for example similar to that previously used for etching the dielectric material 128. The dielectric material retained forms the internal dielectric spacers 112 arranged around the second parts 114 of the portions 104 which form extension regions of the transistor 100.

Allowing for the low thickness value (the dimension parallel to the X axis shown in FIG. 8) of the internal spacers 112 (for example between about 2 nm and 10 nm), the dielectric material 128 used to form the internal dielectric spacers 112 is advantageously of the Low-k type, or of low dielectric permittivity, that is whose dielectric permittivity is less than or equal to about 3.9, in order to retain a sufficient equivalent dielectric thickness. This dielectric material is, for example, SiBCN or SiOCH.

A silicidation step may then be performed in order to form, on the surface of the third parts 116 and of the extremities 118 of the portions 104, a layer of silicide 131.

Figure 9:
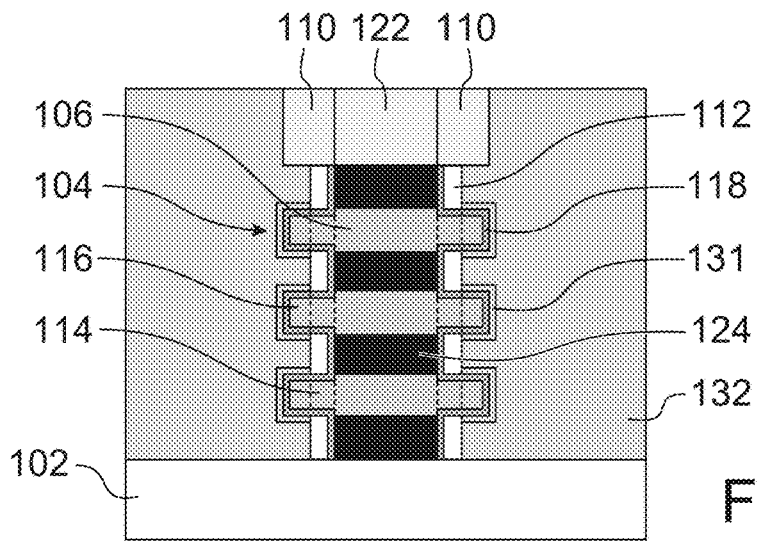

A dielectric encapsulation material 132, for example an oxide such as SiO$_2$, is then deposited, in particular around the structure formed at this stage of the method (FIG. 9). This dielectric encapsulation material 132 is capable of being selectively etched relative to the other materials present in the structure. A chemical mechanical planarization (CMP) step may be performed with stopping on the dummy gate 122 and on the external spacers 110, in order to remove the dielectric encapsulation material present on these elements.

Figure 10:
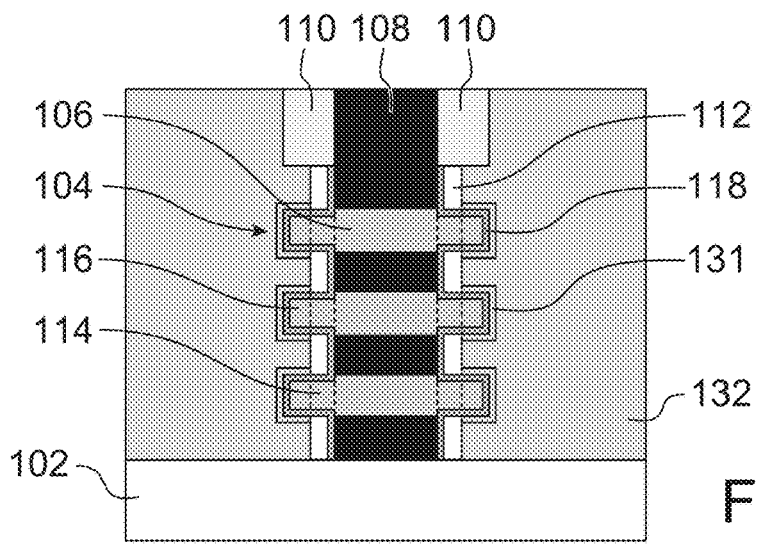

As shown in FIG. 10, the dummy gate 122 and the parts 124 are removed, and the final gate 108 is made in the location previously occupied by the dummy gate 122 and the parts 124, by depositing gate dielectric or dielectrics, or gate conductive material or materials.

Figure 11:
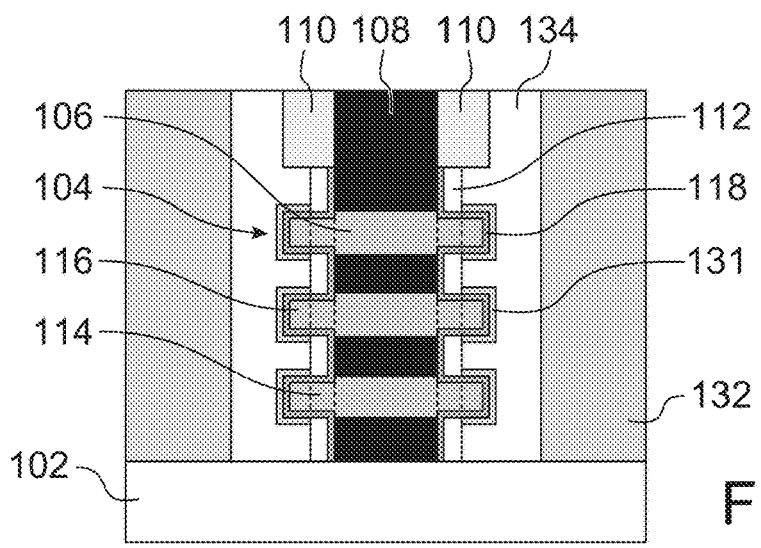

Openings 134 are then made through the dielectric encapsulation material 132 in order to make the extremities 118 and the third parts 116 of the portions 104 accessible (FIG. 11). These openings 134 form locations for future electrically conductive portions of the source and drain regions of the transistor 100.

Figure 12:
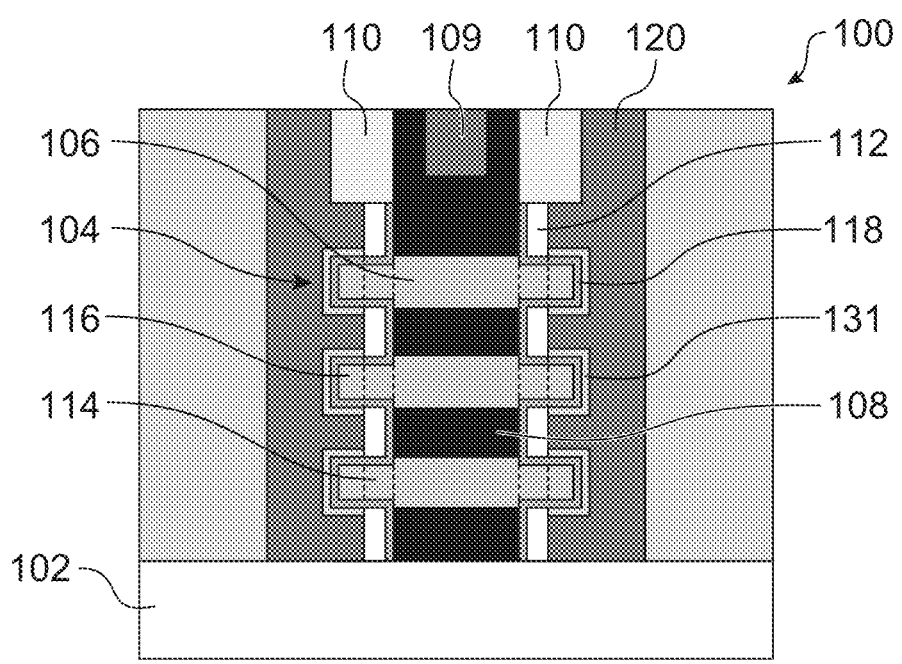

A conforming deposition of electrically conductive material is then carried out in order to make the electrically conductive portions 120 in electrical contact with the silicide layer 131 which covers the extremities 118 and the third parts 116 of the portions 104 (FIG. 12).

Because of the partial etching of the portions 130 used for forming the internal spacers 112 which do not cover the third parts 116 of the portions 104, the contact surface area between the portions 104 and the electrically conductive portions 120 (by means of the silicide layer 131) is greater than when the extremities of the portions 104 alone are in contact with the source and drain of the transistor.

As an alternative to the method described above, it is possible for the step for silicidation of the third parts 116 and of the extremities 118 of the portions 104 not to be implemented between the step forming the internal spacers 112 and the step for deposition of the dielectric encapsulation material 132, but between the step for making the gate 108 and the step for making the electrically conductive portions 120.

In the specific embodiment described above, the doping of the potions 104 is performed by the deposition of a dopant-rich dielectric material, then annealing in order to diffuse the dopants into the portions 104 covered by this dielectric material. Alternatively, the doping of the extremities 118, of the second parts 114 and of the third parts 116 of the portions 104 may be carried out by using other doping techniques such as, for example, doping using plasma.

In the specific embodiment described hereafter the transistor 100 is a GAAFET transistor. Alternatively the transistor 100 may correspond to another type of transistor, for example a FinFET transistor. In this case the transistor comprises one or more portions of semiconductor made in the form of fingers arranged on the substrate 102.

The invention claimed is:

1. A field effect transistor (FET) comprising:
a semiconductor portion of which a first part forms a channel of the FET;
a gate which at least partly surrounds the first part of the semiconductor portion;
internal dielectric spacers arranged around second parts of the semiconductor portion between which the first part of the semiconductor portion is arranged and which form extension regions of the FET;
electrically conductive portions in contact with third parts of the semiconductor portion, forming part of source and drain regions of the FET, at least partly surrounding the third parts of the semiconductor portion, with each of the second parts of the semiconductor portion being arranged between the first part of the semiconductor portion and one of the third parts of the semiconductor portion;
doped portions in a surface of the second parts between internal dielectric spacers and undoped portions of the second parts;
doped extremities of the third parts between the electrically conductive portions and undoped portions of the third parts; and
external dielectric spacers between which the gate is arranged and disposed on an assembly including the second and third parts of the semiconductor portion, the internal dielectric spacers, and the parts of the electrically conductive portions in contact with doped surfaces of the third parts of the semiconductor portion,
wherein the first part, the second parts, the extremities, and the third parts are all formed from a same material that forms the semiconductor portion,
wherein the semiconductor portion is suspended above a substrate,
wherein a part of each of the external dielectric spacers abuts an internal dielectric spacer of the internal dielectric spacers such that a surface of the part of each of the external dielectric spacers and a surface of the internal dielectric spacer abut each other, and the surface of the part and the surface of the internal dielectric spacer both intersect an imaginary line extending from the substrate in a direction normal to the substrate, and
wherein the extremities are surfaces of the semiconductor portion, which are perpendicular to a direction along which the semiconductor portion extends, perpendicular to the surface of the part and the surface of the internal dielectric spacer that abut each other, and parallel to the imaginary line, found at ends of the third parts.

2. The FET according to claim 1, wherein:
a part of the gate is arranged between the first part of the semiconductor portion and the substrate;
a part of each of the internal dielectric spacers is arranged between one of the second parts of the semiconductor portion and the substrate; and
a part of each of the electrically conductive portions is arranged between one of the third parts of the semiconductor portion and the substrate.

3. The FET according to claim 2, comprising several semiconductor portions suspended above the substrate such that the first parts of the semiconductor portions together form the channel, wherein:
the gate surrounds each of the first parts of the semiconductor portions;
the internal dielectric spacers are arranged around the second parts of each of the semiconductor portions; and
the electrically conductive portions are in contact with the doped extremities of each of the semiconductor portions and with the doped surfaces of the third parts of each of the semiconductor portions.

4. The FET according to claim 1, wherein the internal dielectric spacers comprise a material of dielectric permittivity less than or equal to 3.9.

5. The FET according to claim 1, wherein the electrically conductive portions comprise at least one metal.

6. The FET according to claim 1, wherein a layer of silicide is interposed between the doped surfaces of the extremities and the third parts of the semiconductor portion and the electrically conductive portions.

7. The FET according to claim 1, wherein a width of the external dielectric spacers is larger than a width of the internal dielectric spacers.

8. The FET according to claim 7, wherein the width of the internal dielectric spacers corresponds to a width of the second parts of the semiconductor portion.

9. A Method for making at least one of the FET according to claim 1, comprising at least the implementation of the following steps:
   making of at least one of the semiconductor portion the first part of which is intended to form the channel of the FET and which moreover comprises the second parts between which is arranged the first part of the semiconductor portion and intended to form the extension regions of the FET, as well as the third parts intended to form the part of the source and drain regions of the FET and such that each of the second parts of the semiconductor portion is arranged between the first part of the semiconductor portion and one of the third parts of the semiconductor portion;
   making of a dummy gate at least partly surrounding the first part of the semiconductor portion;
   doping of at least the second parts of the semiconductor portion and of the extremities of the semiconductor portion;
   deposition of at least one dielectric material around the second and third parts of the semiconductor portion;
   removal of portions of the dielectric material arranged around the third parts of the semiconductor portion, where remaining portions of the dielectric material arranged around the second parts of the semiconductor portion form the internal dielectric spacers;
   removal of the dummy gate and making, in a location formed by the removal of the dummy gate, of the gate at least partly surrounding the first part of the semiconductor portion;
   making the electrically conductive portions in contact with the doped extremities of the semiconductor portion and with the doped surfaces of the third parts of the semiconductor portion, and at least partly surrounding the third parts of the semiconductor portion.

10. The method according to claim 9 wherein the doping of the extremities and of the second parts of the semiconductor portion is performed by implementing the following steps:
    deposition, at least against the extremities and the third parts of the semiconductor portion, of a dielectric material comprising dopants;
    thermal annealing which diffuses the dopants from the dielectric material comprising the dopants to within the semiconductor of the extremities and of the third parts of the semiconductor portion;
    removal of the dielectric material comprising the dopants.

11. The method according to claim 9, moreover comprising:
    between the steps for removal of the portions of the dielectric material and removal of the dummy gate, deposition of a dielectric encapsulation material arranged against the extremities of the semiconductor portion, the third parts of the semiconductor portion and the internal dielectric spacers;
    between the steps for removal of the dummy gate and making of the electrically conductive portions, a step for etching of locations of the electrically conductive portions in the dielectric encapsulation material, with the electrically conductive portions then being made in the etched locations.

12. The method according to claim 11, moreover comprising between the steps for removal of the portions of the dielectric material and for deposition of the dielectric encapsulation material and/or between the steps for etching the locations of the electrically conductive portions in the dielectric encapsulation material and for making the electrically conductive portions, the implementation of a step for silicidation of the doped surfaces of the extremities and of the third parts of the semiconductor portion.

13. The method according to claim 9, moreover comprising, before the implementation of the doping of the second parts and of the extremities of the semiconductor portion, making of the external dielectric spacers between which the dummy gate is arranged, with the external dielectric spacers being made so that they subsequently partly surround the assembly formed by at least the second and third parts of the semiconductor portion, the internal dielectric spacers, and the parts of the electrically conductive portions in contact with the doped surfaces of the third parts of the semiconductor portion.

* * * * *